United States Patent
Yi et al.

(10) Patent No.: US 9,826,634 B2
(45) Date of Patent: Nov. 21, 2017

(54) FABRICATING A CONDUCTIVE TRACE STRUCTURE AND SUBSTRATE HAVING THE STRUCTURE

(71) Applicant: Taiwan Green Point Enterprises Co., Ltd., Taichung (TW)

(72) Inventors: Sheng-Hung Yi, Taichung (TW); Pen-Yi Liao, Taichung (TW); Min-Hsiang Chen, Taichung (TW)

(73) Assignee: Taiwan Green Point Enterprises, Co., Ltd., Taichung (TW)

( * ) Notice: Subject to any disclaimer, the term of this patent is extended or adjusted under 35 U.S.C. 154(b) by 196 days.

(21) Appl. No.: 14/345,352

(22) PCT Filed: Nov. 27, 2012

(86) PCT No.: PCT/US2012/066686
§ 371 (c)(1),
(2) Date: Mar. 17, 2014

(87) PCT Pub. No.: WO2013/082054
PCT Pub. Date: Jun. 6, 2013

(65) Prior Publication Data
US 2014/0374141 A1    Dec. 25, 2014

Related U.S. Application Data

(60) Provisional application No. 61/563,945, filed on Nov. 28, 2011.

(51) Int. Cl.
*H05K 1/09* (2006.01)
*H05K 3/02* (2006.01)
(Continued)

(52) U.S. Cl.
CPC ............ *H05K 1/09* (2013.01); *H05K 1/0296* (2013.01); *H05K 3/027* (2013.01); *H05K 3/188* (2013.01);
(Continued)

(58) Field of Classification Search
CPC .......... H05K 3/027; H05K 1/09; H05K 1/092; H05K 1/095; H05K 1/097
See application file for complete search history.

(56) References Cited

U.S. PATENT DOCUMENTS 4,532,152 A   7/1985   Elarde
7,384,566 B2  6/2008   Chen et al.
(Continued)

FOREIGN PATENT DOCUMENTS

CN          101094936 A    12/2007

OTHER PUBLICATIONS

International Search Report for PCT/US2012/066686, dated Apr. 19, 2013.
(Continued)

*Primary Examiner* — Jeremy C Norris
(74) *Attorney, Agent, or Firm* — Volpe and Koenig, P.C

(57) ABSTRACT

A method for fabricating a conductive trace structure includes the steps: forming a first metal layer on a non-conductive substrate; removing a part of the first metal layer to expose the non-conductive substrate so as to form the first metal layer into a plating region and a non-plating region, the plating region being divided into at least two trace-forming portions and at least one bridge portion; forming a second metal layer on the plating region by electroplating the plating region using one of the trace-forming portions and the bridge portion as an electrode; and removing the bridge portion and the second metal layer formed on the bridge portion.

16 Claims, 3 Drawing Sheets

(51) Int. Cl.
 *H05K 3/24* (2006.01)
 *H05K 1/02* (2006.01)
 *H05K 3/38* (2006.01)
 *H05K 3/18* (2006.01)
(52) U.S. Cl.
 CPC ............ *H05K 3/242* (2013.01); *H05K 3/182* (2013.01); *H05K 3/243* (2013.01); *H05K 3/381* (2013.01); *H05K 2201/0116* (2013.01); *H05K 2203/0723* (2013.01); *H05K 2203/107* (2013.01); *H05K 2203/108* (2013.01); *H05K 2203/175* (2013.01)

(56) References Cited

U.S. PATENT DOCUMENTS

| | | |
|---|---|---|
| 7,682,703 B2 | 3/2010 | Frey et al. |
| 2007/0235902 A1 | 10/2007 | Fleming et al. |
| 2007/0247822 A1 | 10/2007 | Naundorf |
| 2011/0278050 A1 | 11/2011 | Yi et al. |

OTHER PUBLICATIONS

International Preliminary Report on Patentability for PCT/US2012/066686, issued Jun. 3, 2014.

FABRICATING A CONDUCTIVE TRACE STRUCTURE AND SUBSTRATE HAVING THE STRUCTURE

CROSS-REFERENCE TO RELATED APPLICATION

This application is a 371 National Phase Application of PCT/US2012/066686, filed Nov. 27, 2012, which claims benefit of U.S. provisional application No. 61/563,945, filed on Nov. 28, 2011 which are incorporated herein by reference in their entirety.

BACKGROUND

1. Field

The technology here described relates to a method for fabricating a conductive trace structure and a substrate having the conductive trace structure, more particularly to a method for fabricating a conductive trace structure on a non-conductive substrate and a non-conductive substrate having the conductive trace structure.

2. Description of the Related Art

A conventional method for forming a conductive trace on an insulator substrate, such as a polymer substrate, is generally conducted by directly adhering a conductive material on a surface of the polymer substrate, or by insert molding a conductive material and a polymer material. However, the disadvantages of the aforesaid method include an increased thickness of a final product and difficulty in further design or modification of the conductive trace.

To solve the aforesaid disadvantages in the conventional method of fabricating the conductive trace on the polymer substrate, U.S. Pat. No. 7,060,421 B2 discloses a method for producing a conductive track structure on a non-conductive support, which comprises the following steps: (a) blending a non-conductive metal oxide having a spinel-based structure with a non-conductive polymer material to obtain a substrate; (b) irradiating areas of the substrate on which a conductive track is to be formed with electromagnetic radiation to break down the non-conductive metal oxide and to release metal nuclei; and (c) metalizing the Irradiated areas by chemical reduction, thereby obtaining the conductive track structure. U.S. Patent Application Publication no. US 2007/0247822 discloses another method for fabricating a conductive structure, which comprises the following steps: (a) dispersing aluminum nitride in a non-conductive polymer material to obtain a substrate; and (b) laser ablating a surface of the substrate to break up bonding of the aluminum nitride to obtain reactive aluminum particles and to form a conductive structure on the laser ablated region of the substrate.

Since the conductive structure or the conductive track is formed on the surface of the substrate, the non-conductive metal oxide or aluminum nitride located at the surface of the substrate will be formed into the conductive track/conductive structure. The non-conductive metal oxide or aluminum nitride that is not located at the surface of the substrate is to be functionless. Since the cost for the metal oxide is relatively high, manufacturing costs would be raised. In addition, in an electroplating process for forming a conductive trace structure, since conductive leads of the conductive trace structure are usually formed at different regions, a plurality of electrodes are thus required to be disposed on the regions where the conductive leads are to be formed or plural times of electroplating process are required. A relatively complex electroplating device or a longer processing time is thus required to obtain the conductive structure/conductive track.

Accordingly, finding a method capable of simplifying the fabrication method of a conductive trace structure on a selected region of a polymer substrate is a subject of endeavor in the industry.

SUMMARY

According to one aspect of the technology here described is a method for fabricating a conductive trace structure comprising the steps of:

forming a first metal layer on a non-conductive substrate;

removing a part of the first metal layer to expose the non-conductive substrate so as to form the first metal layer into a plating region and a non-plating region separated from the plating region by the exposed non-conductive substrate, the plating region being divided into at least two trace-forming portions and at least one bridge portion interconnecting the trace-forming portions;

forming a second metal layer on the plating region by electroplating the plating region using one of the trace-forming portions and the bridge portion as an electrode; and removing the bridge portion of the first metal layer and the second metal layer formed on the bridge portion.

According to another aspect of the present technology is a substrate having a conductive trace structure comprises:

a patterned substrate including a substrate body, and a patterned region that is formed on a surface of the substrate body and that includes at least two first pattern areas and at least one second pattern area interconnecting the first pattern areas, each of the first pattern areas having a porous microstructure; and a conductive trace structure formed on the first pattern areas.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENTS

Figure 1:
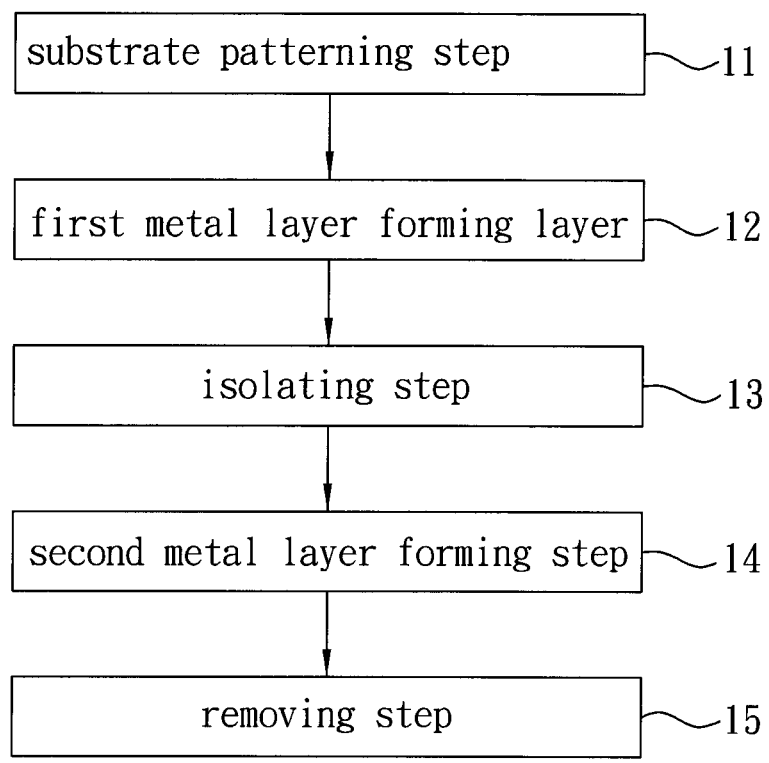
FIG. 1 is a flow chart illustrating the preferred embodiment of a method for fabricating a conductive trace structure according to this invention.
Figure 2:
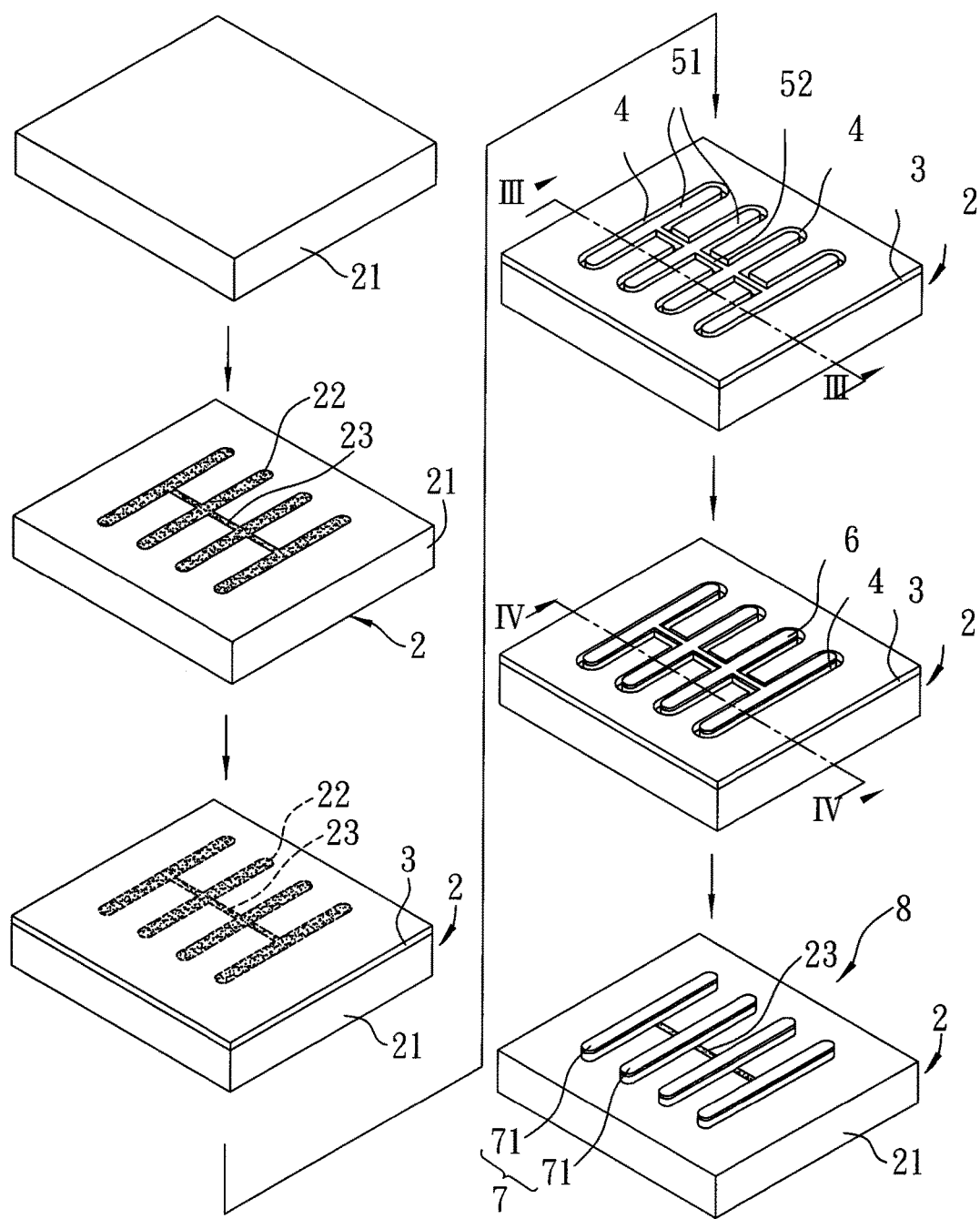
FIG. 2 shows consecutive steps of the method of the preferred embodiment.

FIGS. 1 and 2 illustrate the preferred embodiment of a method for fabricating a conductive trace structure according to this invention. The method comprises: a substrate patterning step 11, a first metal layer forming step 12, an isolating step 13, a second metal layer forming step 14, and a removing step 15.

In the substrate patterning step 11, a substrate 21 is patterned by laser ablating, dry etching, or wet etching to form a patterned substrate 2 with a patterned region formed on a surface thereof. The patterned region includes a plurality of first pattern areas 22 and a plurality of second pattern areas 23 each of which interconnects two of the first pattern areas 22.

The substrate 21 is a non-conductive substrate which is made of, e.g., glass, polymer, ceramic, or combinations thereof. Examples of the polymer include polycarbonate (PC), acrylonitrile-butadiene-styrene (ABS), and acrylate resin. Additives can be added to adjust mechanical properties of the non-conductive substrate based on applications of a final product made using the method of this invention. Since species of the additives for the polymer, are well known to a skilled artisan, further explanation is omitted herein for the sake of brevity.

In an example of this invention, in step 11, the substrate 21 is patterned using laser ablation so as to form the first and second pattern areas 22, 23 each of which has a porous structure. The porous structure of each of the first and second pattern areas 22, 23 facilitates ion adhesion in step 12, and, preferably, has a pore size ranging from 1 µm to 20 µm.

Specifically, in an example of this invention, Nd:YAG laser is used for laser ablation, and the conditions used in the laser ablation are as follows: wavelength of laser: 1064 nm, output power: from 9 W to 30 W, frequency: 5 KHz to 30 KHz, and power density: 1% to 7% of the output power.

In step 12, the patterned substrate 2 is dipped into an activator solution containing active metal ions such that the active metal ions are absorbed on the patterned region to form an activator film. Subsequently, the substrate 2 having the activator film is subjected to electroless plating by dipping the patterned substrate 2 into a chemical plating solution containing metal ions to form a metal film on the activator film. The activator film and the metal film cooperatively form a first metal layer 3. Each of the first and second pattern areas 22, 23 of the patterned region has the porous structure, and thus has good adsorption for the active metal ions.

Preferably, the active metal ions and the metal ions suitable for this embodiment can be selected from the group consisting of palladium, rhodium, osmium, iridium, platinum, gold, nickel, iron, and combinations thereof.

In an example of this invention, the activator film is formed by dipping the patterned substrate 2 in the activator solution containing 5000 ppm palladium metal ions at 50° C. for 5 minutes. The metal film is formed by dipping the patterned substrate 2 formed with the activator film into the chemical, plating solution containing copper sulfate, formaldehyde, and sodium hydroxide for 2 to 5 minutes at 50 to 65° C. Copper ions which form the copper sulfate in the chemical plating solution are reduced into copper element by the palladium ions to form the metal film.

Alternatively, the metal film can be formed using a chemical plating solution containing nickel sulfate and phosphate at 40 to 45° C. for 2 to 5 minutes so that nickel ions form the nickel sulfate oxidize the palladium ions to form a metal film composed of nickel. Note that plural times of electroless plating process can be conducted to form a multi-layered metal film.

Figure 3:
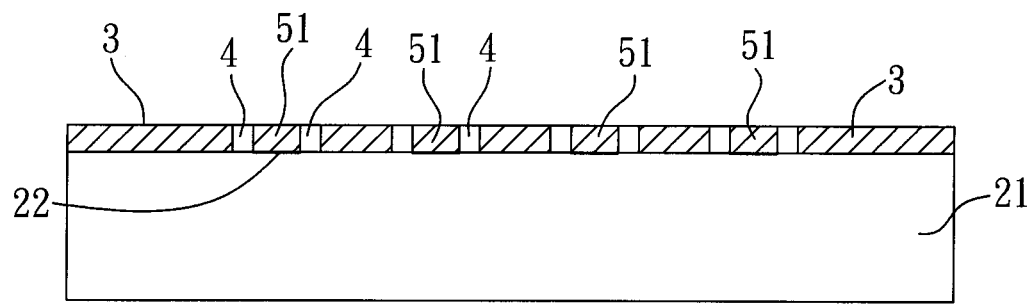
FIG. 3 is a sectional view taken along line of FIG. 2, which illustrates a step of removing a part of a first metal layer to expose a non-conductive substrate of the preferred embodiment (i.e., step 13 of FIG. 1)

As shown in FIGS. 2 and 3, in the isolating step 13, parts of the first metal layer 3 that correspond to peripheries of the first and second pattern areas 22, 23 is removed by, e.g., laser ablation, until the patterned substrate 2 are exposed so as to form the first metal layer 3 into a plating region and a non-plating region which surrounds the plating region and which is separated from the plating region by the exposed non-conductive substrate (hereinafter referred to as an isolation region 4). The plating region is divided into a plurality of trace-forming portions 51 and a plurality of bridge portions 52 each of which interconnects two of the trace-forming portions 51. It is noted that the trace-forming portions 51 of the plating region of the first metal layer 3 correspond in position to the first pattern areas 22 of the patterned substrate 2, and the bridge portions 52 of the plating region of the first metal layer 3 correspond in position to the second pattern areas 23 of the patterned substrate 2. Thus, the patterned region has a pattern corresponding to that of the plating region of the first metal layer 3.

In an example of this invention, Nd:YAG laser is used for laser ablation in step 13, and the conditions used in the laser ablation are as follows: wavelength of laser: 1064 nm, output power: 4 W to 30 W, frequency: 5 KHz to 30 KHz, and power density: 1% to 7% of the output power.

Figure 4:
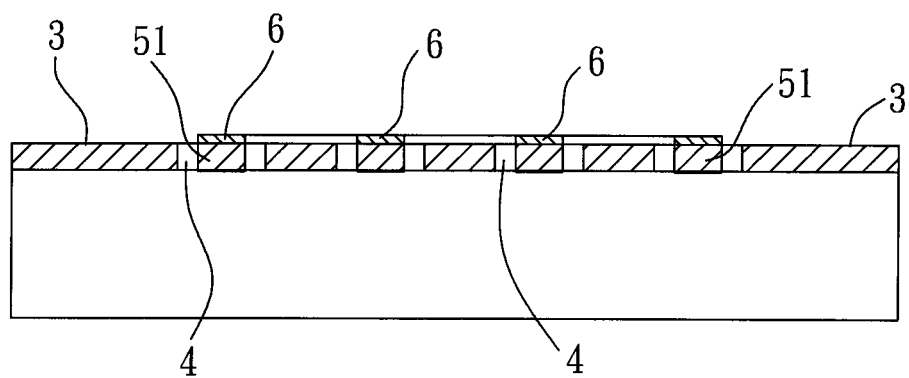
FIG. 4 is a sectional view taken along line IV-IV of FIG. 2, which illustrates a step of forming a second metal layer on a plating region of the first metal layer (i.e., step 14 of FIG. 1).

FIG. 4 is a sectional view taken along b-b in FIG. 2, which illustrates the second metal layer forming step 14. The second metal layer forming step 14 is formed by electroplating a metal material (e.g., copper or nickel) on the plating region so as to form a second metal layer on the plating region, in which one of the trace-forming portions 51 and the bridge portions 52 is selected to be a first electrode. A second electrode is applied to provide electricity to the plating region. The metal material suitable for the electroplating process of step 14 and the electroplating process are known to a skilled artisan and thus detailed explanations are omitted herein for the sake of brevity.

Note that since the bridge portions 52 interconnect the trace-forming portions 51, deposition of the second metal layer 6 can be performed by a single electroplating process using one of the trace-forming portions 51 and the bridge portions 52 as the first electrode. Thus, the method of this invention is relatively cost effective as compared to the conventional method in which a plurality of first electrodes or plural times of electroplating process is required. It should be noted that the plating region can be divided into a plurality of isolated sub-regions. In each of the isolated sub-regions, the trace-forming portions 51 are interconnected by the bridge portions 52. Various metal materials for the second metal layers can be deposited on the isolated sub-regions.

In the removing step 15, the bridge portion 52 of the first metal layer 3, the second metal layer 6 formed on the bridge portion 52, and the first metal layer on the non-plating region are removed by laser ablation, a chemical removing method, or a physical processing method (e.g., waterjet) to form a plurality of isolated conductive traces 71. The method for fabricating a conductive trace structure 7 is thus completed to obtain a substrate with a conductive trace structure 7 composed of the isolated conductive traces 71.

In step 15, laser ablation with the aforesaid conditions can be applied to conduct the removing step 15. Cutting is an example for the physical processing method. The chemical removing method can be performed by dipping the patterned substrate 2 which first and second metal layers 3, 6 into a chemical solution. Since the trace-forming portions 51 have a width longer than that of the bridge portions 52, by controlling the dipping time, the bridge portions 52 and the second metal layer formed thereon can be effectively removed without adversely affecting the trace-forming portions 51. Note that, when the chemical removing method is used in the removing step 15, to avoid affecting the trace-forming portions 51 and thus reducing conductivity of the conductive trace structure, the first metal layer 3 formed in step 12 can be formed with a larger thickness. After removing the bridge portions 52, the second pattern areas 23 with porous structures are exposed and are disposed among the isolated conductive traces 71.

Since a pin hole would be formed in one of the trace-forming portions 51 and the bridge portions 52 (which is used as the first electrode) due to external power connection, one of the bridge portions 52 which are to be removed in the removing step 15 is preferably selected as the first electrode to prevent pin-hole problem in the conductive trace structure 7 so that the conductive trace structure 7 could have a planar and smooth surface.

In summary, with formation of the bridge portions 52, the plurality of conductive traces 71 of the conductive trace structure 7 can be formed in a single electroplating process. Moreover, by virtue of laser ablation in step 11, the first and second pattern areas 22, 23 thus formed have porous structures which facilitate active metal ion adsorption in step 12.

While the present invention has been described in connection with what are considered the most practical and preferred embodiments, it is understood that this invention is not limited to the disclosed embodiments but is intended to cover various arrangements included within the scope of the broadest interpretations and equivalent arrangements.

Broadly, this writing discloses the following. A method for fabricating a conductive trace structure includes the steps: forming a first metal layer on a non-conductive substrate; removing a part of the first metal layer to expose the non-conductive substrate so as to form the first metal layer into a plating region and a non-plating region, the plating region being divided into at last two trace-forming portions and at least one bridge portion; forming a second metal layer on the plating region by electroplating the plating region using one of trace-forming portions and the bridge portion as an electrode; and removing the bridge portion and the second metal layer formed on the bridge portion.

All elements, parts and steps described herein are preferably included. It is to be understood that any of these elements, parts and steps may be replaced by other elements, parts and steps or deleted altogether as will be obvious to those skilled in the art.

Concepts

This writing presents at least the following concepts.

1. A method for fabricating a conductive trace structure, comprising the steps:
    forming a first metal layer on a non-conductive substrate;
    removing a part of the first metal layer to expose the non-conductive substrate so as to form the first metal layer into a plating region and a non-plating region separated from the plating region by the exposed non-conductive substrate, the plating region being divided into at least two trace-forming portions and at least one bridge portion interconnecting the trace-forming portions;
    forming a second metal layer on the plating region by electroplating the plating region using one of the trace-forming portions and the bridge portion as an electrode; and
    removing the bridge portion of the first metal layer and the second metal layer formed on the bridge portion.

Concept 2. The method of concept 1, wherein the step of of removing a part is conducted by laser ablation.

Concept 3. The method of concept 1 or 2, further comprising, before the step of forming a first metal layer, a step of patterning the non-conductive substrate to form a patterned region on a surface of the non-conductive substrate, the patterned region having, a pattern corresponding to that of the plating region of the first metal layer.

Concept 4. The method of concept 3 wherein the step of forming a first metal layer involves dipping the non-conductive substrate into an activator solution containing active metal ions such that the active metal ions are adsorbed on the non-conductive substrate to form an activator film, and forming a metal film on the activator film by electroless plating, the activator film and the metal film cooperatively forming the first metal layer.

Concept 5. The method of concept 3 or 4, wherein the step of removing a part and the step of patterning are conducted by laser ablation at conductions of a laser power ranging from 4 W to 30 W, a frequency ranging from 5 KHz to 30 KHz, and a laser power density ranging from 1% to 7% of the output power.

Concept 6. The method of concept 4, wherein the active metal ions are selected from the group consisting of palladium, rhodium, osmium, iridium, platinum, gold, nickel, iron, and combinations thereof.

Concept 7. The method of any one of the preceding concepts, wherein the step of removing the bridge is conducted by laser ablation, chemical removing method, or physical processing method.

Concept 8. The method of any one of the preceding concepts, wherein, in the step of forming a second metal layer, the bridge portion is used as the electrode.

Concept 9. A substrate having a conductive trace structure, comprising:
    a patterned substrate having a patterned region that is formed on a surface of said patterned substrate and that includes at least two first pattern areas and at least one second pattern area interconnecting said first pattern areas, each of said first pattern areas having a porous microstructure; and
    a conductive trace structure formed on said first pattern areas.

Concept 10. The substrate of concept 9, wherein said porous microstructure of each of said first pattern areas is formed by laser ablating said surface of said patterned substrate.

Concept 11. The substrate of concept 9 or 10, wherein said patterned substrate is made of a non-conductive material.

Concept 12. The substrate of concept 11, wherein said non-conductive material consists of a polymer.

Concept 13. The substrate of concept 9, 10, 11, or 12, wherein said porous microstructure has a pore size ranging from 1 µm to 20 µm.

Concept 14. The substrate of concept 9, 10, 11, 12, or 13, wherein said second pattern area is formed by laser ablation.

Concept 15. The substrate of any one of concepts 9-14, wherein said conductive trace structure has a planar and smooth surface.

Concept 16. A method for fabricating a conductive trace structure including the steps of:
forming a first metal layer on a non-conductive substrate;
removing a part of the first metal layer to expose the non-conductive substrate so as to form the first metal layer into a plating region and a non-plating region, the plating region being divided into at last two trace-forming portions and at least one bridge portion;

forming a second metal layer on the plating region by electroplating the plating region using one of the trace-forming portions and the bridge portion as an electrode; and removing the bridge portion and the second metal layer formed on the bridge portion.

What is claimed is:

1. A substrate having a conductive trace structure, consisting essentially of:
   a patterned substrate having a patterned region that is formed on a surface of said patterned substrate and that includes at least two first pattern areas and at least one second pattern area interconnecting said first pattern areas, each of said first pattern areas having a porous microstructure; and
   a conductive trace structure only formed on said first pattern areas, and including an activator film that has active metal.

2. The substrate of claim 1, wherein said porous microstructure of each of said first pattern areas is formed by laser ablating said surface of said patterned substrate.

3. The substrate of claim 1, wherein said patterned substrate is made of a non-conductive material.

4. The substrate of claim 3, wherein said non-conductive material consists of a polymer.

5. The substrate claim 1, wherein said porous microstructure has a pore size ranging from 1 µm to 20 µm.

6. The substrate of claim 1, wherein said second pattern area is formed by laser ablation.

7. The substrate of claim 1, wherein said conductive trace structure has a planar and smooth surface.

8. The substrate of claim 1, wherein said active metal is selected from the group consisting of palladium, rhodium, osmium, iridium, platinum, gold, nickel, iron, and combinations thereof.

9. A method for fabricating a conductive trace structure, comprising the steps:
   forming a first metal layer on a non-conductive substrate;
   removing a part of the first metal layer to expose the non-conductive substrate so as to form the first metal layer into a plating region and a non-plating region separated from the plating region by the exposed non-conductive substrate, the plating region being divided into at least two trace-forming portions and at least one bridge portion interconnecting the trace-forming portions;
   forming a second metal layer on the plating region by electroplating the plating region using one of the trace-forming portions and the bridge portion as an electrode; and
   removing the bridge portion of the first metal layer and the second metal layer formed on the bridge portion,
   wherein the non-conductive substrate is patterned to form a patterned region on a surface of the non-conductive substrate prior to forming the first metal layer on the non-conductive substrate, the patterned region corresponding in position to the plating region of the first metal layer and having a porous microstructure.

10. The method of claim 1, wherein the step of removing a part is conducted by laser ablation.

11. The method of claim 1, wherein the step of forming a first metal layer involves dipping the non-conductive substrate into an activator solution containing active metal ions such that the active metal ions are adsorbed on the non-conductive substrate to form an activator film, and forming a metal film on the activator film by electroless plating, the activator film and the metal film cooperatively forming the first metal layer.

12. The method of claim 11, wherein the active metal ions are selected from the group consisting of palladium, rhodium, osmium, iridium, platinum, gold, nickel, iron, and combinations thereof.

13. The method of claim 1, wherein the step of removing a part and the step of patterning are conducted by laser ablation at conductions of a laser power ranging from 4 W to 30 W, a frequency ranging from 5 KHz to 30 KHz, and a laser power density ranging from 1% to 7% of the output power.

14. The method of claim 1, wherein the step of removing the bridge is conducted by laser ablation, chemical removing method, or a physically processing method.

15. The method of claim 1, wherein, in the step of forming a second metal layer portion is used as the electrode.

16. A method for fabricating a conductive trace structure including the steps of:
   forming a first metal layer on a non-conductive substrate;
   removing a part of the first metal layer to expose the non-conductive substrate so as to form the first metal layer into a plating region and a non-plating region, the plating region being divided into at last two trace-forming portions and at least one bridge portion;
   forming a second metal layer on the plating region by electroplating the plating region using one of the trace-forming portions and the bridge portion as an electrode; and
   removing the bridge portion and the second metal layer formed on the bridge portion,
   wherein the non-conductive substrate is patterned to form a patterned region on a surface of the non-conductive substrate prior to forming the first metal layer on the non-conductive substrate, the patterned region corresponding in position to the plating region of the first metal layer and having a porous microstructure.

* * * * *